United States Patent
Yanagisawa

(10) Patent No.: US 8,241,535 B2
(45) Date of Patent: Aug. 14, 2012

(54) METHOD FOR TRANSCRIBING PATTERNS ON RESIN BODY, METHOD FOR MANUFACTURING PLANAR WAVEGUIDE, AND METHOD FOR MANUFACTURING MICRO-LENS

(75) Inventor: Masaki Yanagisawa, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 1391 days.

(21) Appl. No.: 11/477,195

(22) Filed: Jun. 27, 2006

(65) Prior Publication Data
US 2006/0290017 A1    Dec. 28, 2006

(30) Foreign Application Priority Data
Jun. 28, 2005   (JP) ................ 2005-188421

(51) Int. Cl.
*B29D 11/00* (2006.01)
(52) U.S. Cl. ............................................ 264/1.27
(58) Field of Classification Search .......... 264/496, 264/1.27
See application file for complete search history.

(56) References Cited

U.S. PATENT DOCUMENTS

| 5,772,905 A | 6/1998 | Chou |
| 6,878,634 B2 | 4/2005 | Imada et al. |
| 6,939,487 B1 * | 9/2005 | Ajello et al. ............... 264/2.6 |

FOREIGN PATENT DOCUMENTS

| JP | H04-170328 A | 6/1992 |
| JP | H11-189425 A | 7/1999 |
| JP | 2003-089532 A | 3/2003 |
| JP | 2004-066447 | 3/2004 |
| JP | 2004-288802 A | 10/2004 |

OTHER PUBLICATIONS

Wang et al., "Fabrication of 10 nm enclosed nanofluidic channels." Applied Physics Letters, 8(1):174-176 (2002).
Vratzov et al., "Large scale ultraviolet-based nanoimprint lithography." J. Vac. Sci. Tech. B21(6):2760-2764 (2003).

* cited by examiner

*Primary Examiner* — Larry Thrower
(74) *Attorney, Agent, or Firm* — Fish & Richardson P.C.

(57) ABSTRACT

The present invention is to provide a method for manufacturing a planar optical waveguide and a micro-lens using a transcribed resin formed by the optical nano-imprint technique. The method includes a step for forming a resin contained with ultraviolet curable materials on the substrate. The mold is pressed against the resin. This step forms a patterned resin that reflects the pattern formed in the mold. After hardening the resin by irradiating the ultraviolet rays, the resin is cooled down as the mold is pressed against the resin from the temperature $T_1$, where the mold is pressed, to $T_2$ below $T_1$. After cooling down the temperature of the resin, the mold is detached to complete the resin with the pattern transcribed from the mold.

14 Claims, 6 Drawing Sheets

METHOD FOR TRANSCRIBING PATTERNS ON RESIN BODY, METHOD FOR MANUFACTURING PLANAR WAVEGUIDE, AND METHOD FOR MANUFACTURING MICRO-LENS

BACKGROUND OF THE INVENTION

1. Field of the Invention

The present invention relates to a method for forming a resin body, a structure for an optical waveguide, and an optical part including an optical lens.

2. Background Arts

The nano-imprint technology has been developed and progressed. Recently, the lithography applied in the integrated circuit becomes hard to clear the investment against the profitability because the exposure wavelength becomes the sub-nanometer or shorter which extremely raises the price of the exposure equipment. The nano-imprint technology has been attracted as a replaceable means for the lithography. The United States patent, U.S. Pat. No. 5,772,905, has proposed, what is called, the nano-imprint technology to form a structure with a size of nano-meter by directly pressing the mold with unevenness against the material under processed.

Roughly two types of the nano-imprint technology are known, one of which is the optical nano-imprint technology, while, the other is the thermal nano-imprint technology. Vratzov et. al has disclosed a technique relating to the optical nano-imprint, in which the resin body nano-imprinted at a room temperature is hardened by irradiating the ultraviolet rays and the mold is detached from the resin body to leave the pattern on the resin body (B/ Vratzov et al., "Large scale ultraviolet-based nanoimprint lithography," J. Vac. Sci. Tech vol. B21(6), (2003) pp. 2760).

The Japanese Patent Application published as JP-2004-066447A has disclosed the thermal nano-imprint technology to form a substrate with holes in desired positions. This method includes steps of, preparing a mold with a plurality of projections and a substrate spin-coated with a thermoplastic resin, forming hollows transcribed from the projections in the mold by pressing the mold against the resin body at a high temperature (120° C.), solidifying the resin by cooling the temperature down to 60° C. to form the patterned resin transcribed from the pattern on the mold, exposing at least a portion of the surface of the substrate by etching the resin body, and finally, forming holes in the substrate by the anodic oxidization of the substrate. This nano-structure (holes formed in the substrate) for the fluid is to be used in the analysis and the handling of the bio-molecular such as the DNA and the protein.

Wang et al. has disclosed the nano-imprint technology applicable to the semiconductor integrated circuit (Jian Wang et al., "Fabrication of 10 nm enclosed nanofluidic channels," Appl. Phys. Lett., vol. 81(1) (2002) pp. 174).

The present invention is to provide a method for form a resin transcribed with a pattern with less defects from the mold by the optical nano-imprint technique.

SUMMARY OF THE INVENTION

One aspect of the present invention relates to a method for forming an optical waveguide. The method includes steps of; (a) forming a resin body containing with an ultraviolet curable resin on a substrate, (b) pressing a mold, which is made of material with a thermal expansion coefficient smaller than that of the resin body and provides a pattern of an optical waveguide, against the resin body at a first temperature, (c) hardening the resin body by irradiating the ultraviolet rays on the resin body as the mold is pressed against the resin body; (d) shrinking the resin body by cooling the temperature of the mold and the resin body down to a second temperature lower than the first temperature as the mold is pressed against the resin body; and (e) detaching the mold from the resin body to form the resin body with the transcribed pattern from the mold as maintaining the temperature in the second temperature.

In the method according to the present invention, the step (c) of irradiating the ultraviolet rays is preferable to irradiate through the mold. However, it may be applicable to irradiate through the substrate. By hardening the resin body with the irradiation of the ultraviolet rays, the etching resistance of the resin body may be enhanced.

Moreover, the method may further include a step of, (f) changing the temperature of the resin body again to a third temperature higher than the second temperature after forming the resin with the transcribed patterns, and the first and third temperatures are preferably equal to each other. Since the formation of the pattern to be transcribed to the resin body is carried out in the room temperature and the process using this pattern as a mask is also carried out in the room temperature, the dimensional accuracy of the pattern may be maintained.

Another aspect of the present invention relates to a method for forming an optical waveguide that comprises steps of, in the step (a) above mentioned, the resin is formed in a first region including at least the surface of the substrate with a first refractive index, (f) forming the first region having the pattern corresponding to the pattern on the resin body by etching the first region with the resin body with the pattern transcribed from the mold as a mask after the step (e) above, and (g) forming, on the first region, a second region with a pattern corresponding to the pattern in the first region, the second region having the second refractive index different from the first refractive index.

The method may further include a step of (h) forming, on the first and second regions, a third region having a third refractive index smaller than the second refractive index. The second region constitutes a core of the optical waveguide, while, the first and third regions constitutes the cladding. Moreover, the first to third regions may be made of silicon oxide.

Still another aspect of the present invention relates to a method for forming a micro-lens. The method comprises steps of, in the step (a) above, forming a resin body in the first region that includes at least a surface of the substrate that forms the micro lens, and (f) etching the resin body and the first region by the ion milling by the resin body with the pattern of the micro lens transcribed from the mold as the mask after the step (e) above. Moreover, the method may further include, after the step (e) and before the step (f), forming the mask by isotropic etching of the resin body with the transcribed pattern of the micro lens simultaneously with exposing the surface of the first region.

BRIEF DESCRIPTION OF DRAWINGS

FIGS. from 1A to 1D show a method for forming a pattern on the resin body by the optical nano-imprint technique;

FIGS. from 2A to 2C show processes for forming an optical waveguide;

Figure 2A:
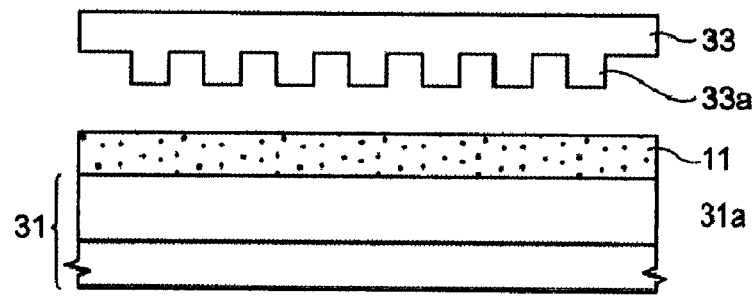
Figure 2B:
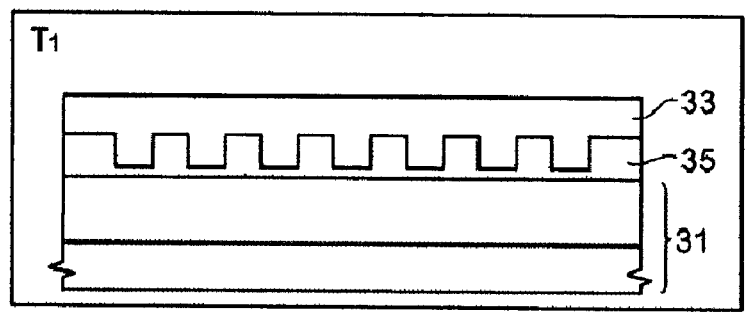
Figure 2C:
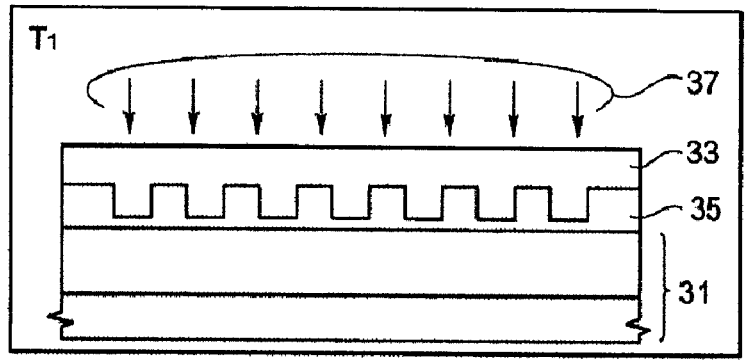
Figure 3A:
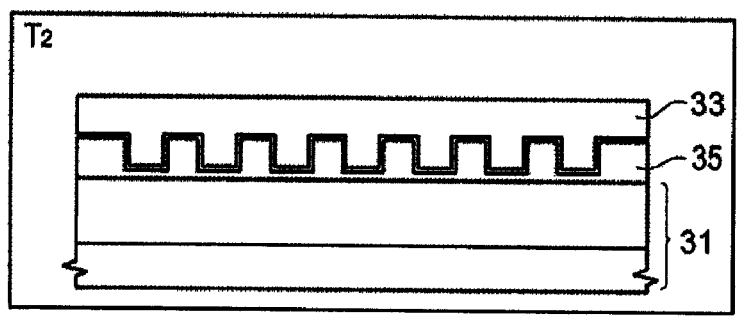
Figure 3B:
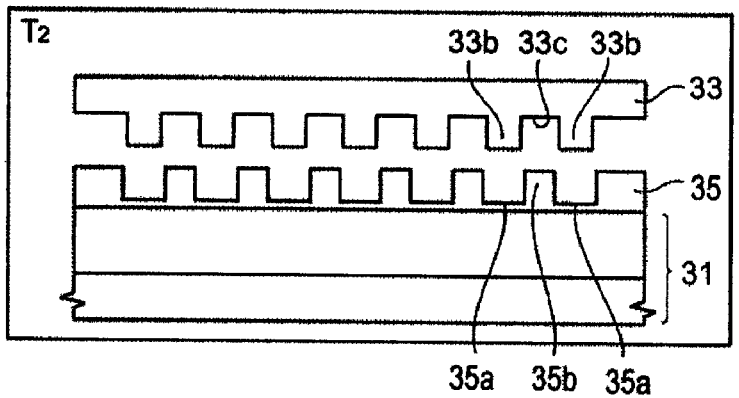
Figure 3C:
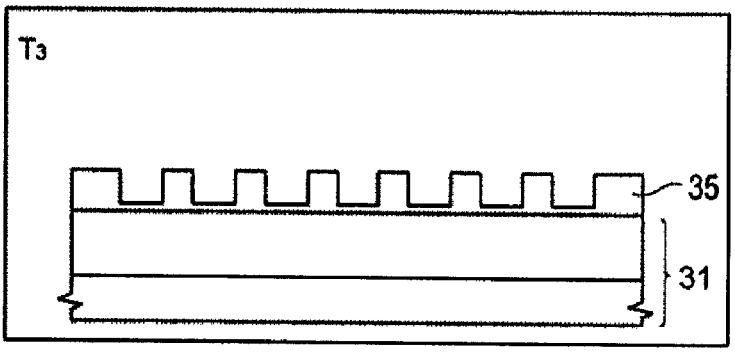
Figure 4A:
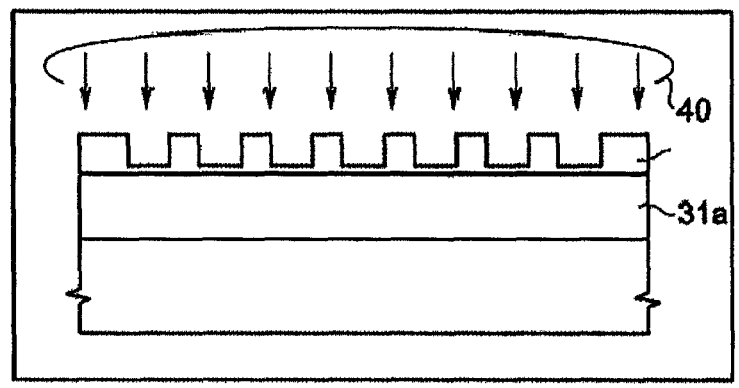
Figure 4B:
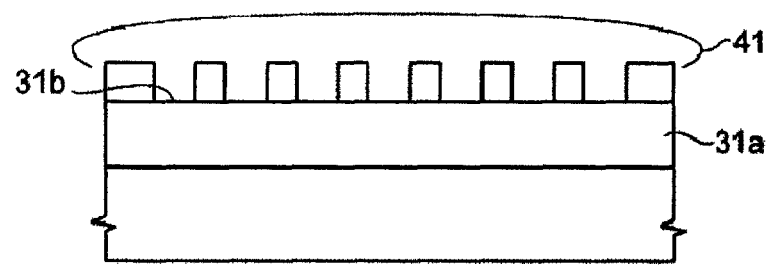
Figure 4C:
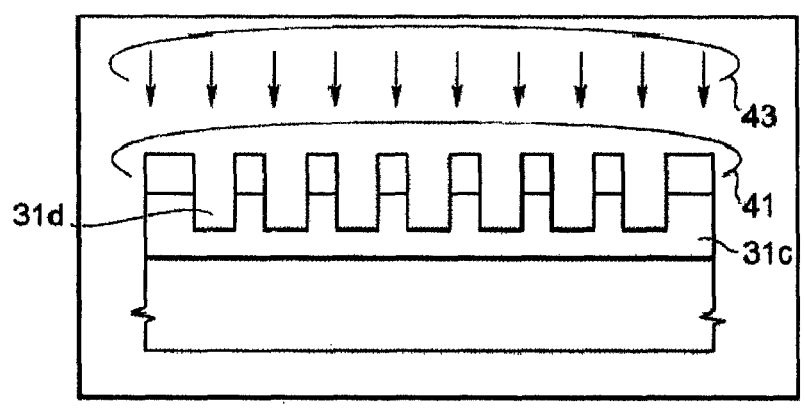

FIGS. from 3A to 3C show processes for forming the optical waveguide subsequent to that shown in FIG. 2C;

FIGS. from 4A to 4C show processes for forming the optical waveguide subsequent to that shown in FIG. 3C;

FIGS. from 5A to 5C show processes for forming the optical waveguide subsequent to that shown in FIG. 4C;

FIGS. from 6A to 6C show processes for forming the micro-lens.

DESCRIPTION OF PREFERRED EMBODIMENTS

The subjects of the present invention will be easily understood by taking the following detailed description into account as referring to accompanying drawings shown as examples. Next, a process for forming a resin body, for forming a structure for an optical waveguide, and for forming an optical part according to embodiments of the present invention will be described. The same numerals or symbols will refer to the same elements if possible.

(First Embodiment)

Figure 1A:
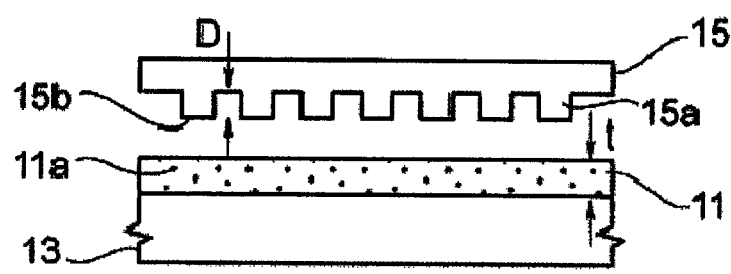
Figure 1B:
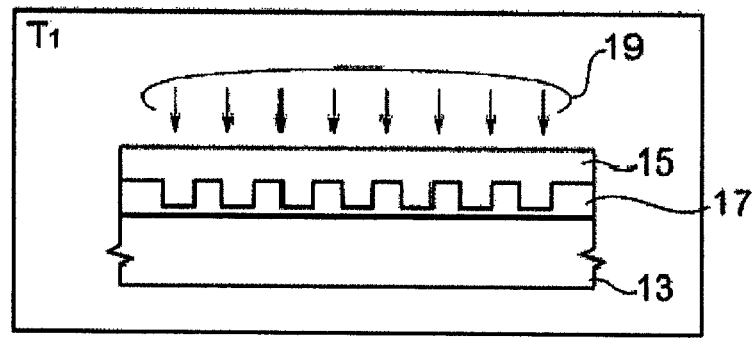

A method for transcribing a pattern on a resin body by the optical nano-imprint technique will be described as referring to drawings from FIG. 1A to FIG. 1D. As shown in FIG. 1A, the resin body is formed on the substrate 13. The resin body 11 contains an ultraviolet curable agent 11a. The substrate 13 is, at least a surface portion thereof, made of material that enables to reflect, by the etching or like, the shape of the resin body transcribed with the pattern. An acrylic resin, an epoxy resin or polyester resin added with a photopolymerizability monomer and a photoinitiator may be applied to the resin body 11 containing the ultraviolet curable agent 11a, and the thickness t of the resin body 11 is greater than a depth D of the pattern 15a formed on the primary surface 15b of the mold 15. The resin body 11 is formed by, for example, a spin coating of the resin, the dripping or the pasting of the resin film.

Next, the mold 15 with predetermined patters 15a is prepared. The mold 15 is made of material with a thermal expansion coefficient smaller than that of the resin body 11, which is, for example, silica. The material for the mold 15 is preferably transparent for the ultraviolet rays. The silica, which is transparent for the ultraviolet rays, has the desirable mechanical strength and workability.

The temperature of the resin body 11 and the mold 15 is set to the first temperature $T_1$. The first temperature $T_1$ is set, for example, between +25° C. to +120° C. As explained later, by setting this first temperature $T_1$ to the room temperature, the dimensions of the pattern in the mold 15 may be accurately reflected in the resin body 11. As the temperature of both members is kept to $T_1$, the mold 15 is pressed against the resin body 11 a shown in FIG. 1B. The resin body 17 deformed so as to reflect the patterns 15a of the mold 15 may be formed by this pressing. When the temperature $T_1$ is set higher than the room temperature, for example 100° C., the reflection of the pattern of the mold 15 on the resin body 11 may be easily and exactly carried out because the viscosity of the resin body 11 reduces. Subsequently, ultraviolet rays 19 are irradiated on the resin body 17 as the mold 15 is pressed against the resin body 17 and the temperature thereof is maintained at $T_1$. As a result, the ultraviolet curable agent 11a within the resin body 17 may be cured and hardens the resin body. The ultraviolet rays 19 are preferable to be irradiated through the mold 15. However, when the substrate 13 is made of material transparent to the ultraviolet rays, the ultraviolet rays may be irradiated through the substrate 13.

Figure 1C:
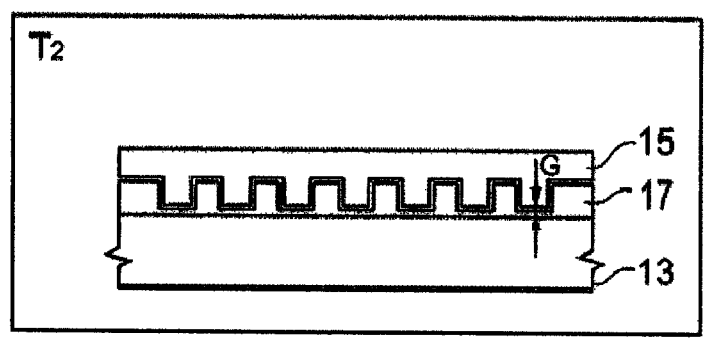

Next, as shown in FIG. 1C, the temperature of the mold 15 and the resin body 17 is cooled from the first temperature $T_1$, down to the second temperature $T_2$ below the first temperature, for example, −100° C. as the mold 15 is pressed against the resin body 17. The change of the temperature, $\Delta T$ ($=T_1-T_2$), is preferably between 50° C. and 200° C., namely, preferably to be secured at least 50° C. The resin body 17 shrinks by an amount determined by the change of the temperature and the thermal expansion coefficient thereof. The mold 15 is also shrunk but the amount of the shrink of the resin body 17 is greater than that of the mold 15 because the thermal expansion coefficient of the mold 15 is far smaller than that of the resin body 17. Thus, as shown in FIG. 1C, a gap G may be formed between the pattern of the resin body 17 and that of the mold 15. The second temperature $T_2$ is preferable to be between −100° C. to +25° C.

Figure 1D:
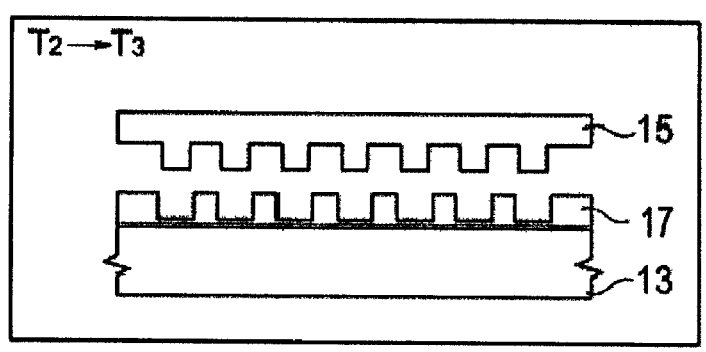

Next, as shown in FIG. 1D, the mold 15 is detached from the resin body 17. According to the present method, the resin body 17 with the pattern with fewer defects may be obtained.

After the resin body 17 with the transcribed patterns is formed, the temperature thereof is changed to the third temperature $T_3$ higher than the first temperature $T_1$. The third temperature $T_3$ is preferable to be lower than the first temperature $T_1$. In the case that the third temperature $T_3$ is between +10° C. and +50° C. and the first temperature $T_1$, under which the mold 15 is pressed against the resin body 17, is set to be the room temperature, the deviation can be reduced between the dimension of the patterns originally attributed to the mold 15 and those finally formed in the resin body.

That is, when the mold 15 is made of high purity synthetic quarts, which may be used in the mask blank of the stepper, the thermal expansion coefficient of the quartz is about $5 \times 10^{-7}$ /K. On the other hand, when the acrylic resin is used for the primary material of the ultraviolet curable resin, the thermal expansion coefficient thereof is about $10^{-5}$ to $10^{-6}$/K, which are one or two digits larger than that of the quarts. Cooling the temperature of the substrate, the resin body, and the mold, in the whole portion thereof or at least in a portion continuous to the substrate, down by about 50° C. after the irradiation of the ultraviolet rays as pressing the mold against the resin body, the mold made of quarts shrinks about 25 ppm at the room temperature, while the resin body shrinks about 200 to 400 ppm. Thus, according to the difference of this shrink, the gap may be formed between the silica mold and the resin body to make it easy to detach the mold from the resin body. After detaching the mold from the resin body at $T_2$, the temperature of the resin body is set to the room temperature, the patterns on the mold can be accurately reflected on the resin body.

(Second Embodiment)

A method for forming an optical waveguide according to the second embodiment of the present invention will be described. As shown in FIG. 2A, in the first region 31a of the surface portion of the substrate 31 is formed with the resin body 11 containing the ultraviolet curable agents 11a. The first region 31a may be a silicon oxide with the first refractive index. The formation of the resin 11 is carried out by the similar method to those explained in the first embodiment, namely, the spin coating, the dripping, or the pasting of film. The mold 33 is prepared, which is made of material with a thermal expansion coefficient smaller than that of the material of the resin body 11 is prepared. The mold 33 has a pattern of the optical waveguide 33a.

The mold 33 is pressed against the resin body 11 at the temperature T1 to transcribe the pattern 33a of the mold 33 on the resin body 35 (FIG. 2B). The ultraviolet rays are irradiated on the resin body 35 as the mold 33 is pressed against the resin body 35 to harden the resin body 35 (FIG. 2C). The temperature of the mold 33 and the resin body 35 is cooled down to $T_2$ as the mold 33 is pressed against the resin body 35. The mold 33 and the resin body 35 each shrinks to form a gap therebetween (FIG. 3A). The mold 33 is detached from the resin 35 at $T_2$. The resin body 35 is transcribed in the first portion 35a with a hollow by pressing of the mold 15 and in the second portion 35b with an protruding shape corresponding to the hollow 33c between the projections 33b of the mold 33 (FIG. 3B). After transcribing the resin body 35, the temperature thereof is changed to the third temperature $T_3$. As explained, the dimension of the hardened resin body 35, for example, the width of the projection 35b or the width of the groove 35a, can become the desired value by setting the first $T_1$ and third temperatures $T_3$ to the room temperature.

Next, as shown in FIG. 4A, the resin 35 is etched. The etching 43 is carried out by the reactive ion-etching (RIE), using a plasma 40 of, for example, a mixed gas of oxygen 7 sccm and trifluoromethane 20 sccm with a pressure of 2.7 Pa (20 mTorr) generated by a microwave, a frequency of which is 13.56 MHz with an output power of 45 W and a DC bias of −200V. Since the first portion 35a of the resin body 35 where the pattern is transcribed and the second portion 35b may be equally etched primarily in a depth direction by using an anisotropic etching of the RIE 43, the dimension of the pattern in the mold 33 may be maintained in the resin 35 when the surface 31b of the first region 31a exposed in the first portion 35a, namely, the first portion 35a is fully etched (FIG. 4B). Thus, the mask 41 with the desired pattern may be formed to be served for the etching of the first region 31a.

As shown in FIG. 4C, to etch the first region 31a of the substrate 31 forms the pattern for the waveguide in the first region 31c. When the first region 31a is made of silicon oxide, this etching may be carried out by the RIE under the condition of, for example, a plasma of the mixed gas of carbon tetrafluoride ($CF_4$) 40 sccm and hydrogen ($H_2$) 5 sccm with a pressure of 6.7 Pa (50 mTorr) generated by the microwave, a frequency of which is 13.56 MHz with an output power of 60 W and a DC bias of −200 V. This condition etches the first region 31a selective to the mask 41. As a result, the first region 31a not covered by the mask 41 may be etched and the groove 31d may be formed corresponding to the pattern of the mask 41.

Figure 5A:
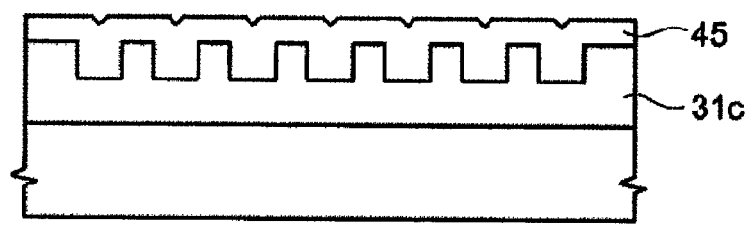
Figure 5B:
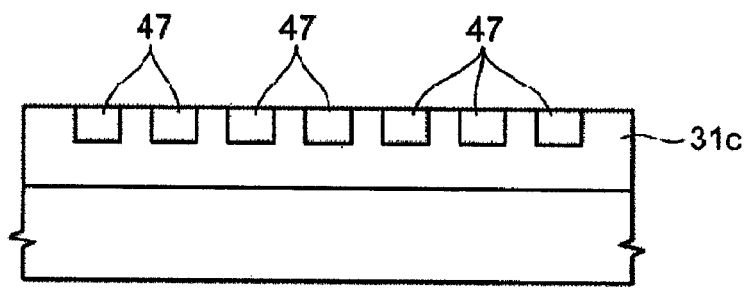

As shown in FIG. 5A, the groove 31d may be buried by the second film 45 deposited enough thicker than the depth of the groove 31d. Subsequently, the second film 45 is removed in a portion not burying the groove 31d to form the second region 47. The removal of the second film may be carried out by, for example, the polishing or the etching back. Thus, the structure of the second region 47 buried within the first region 31c may be completed. The second film 45 is made of material with a refractive index thereof different from that of the first region 31c, and the second region 47 reflects this difference in the refractive index, as shown in FIG. 5B. The second region 47 may be a silicon oxide with the second refractive index.

Figure 5C:
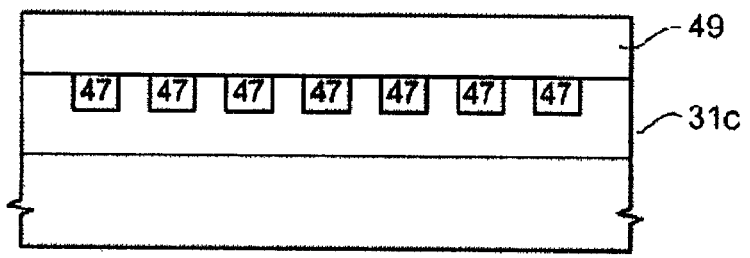

Next, as shown in FIG. 5C, the third film 49 is deposited on the first and second regions, 31c and 47. The third film 49 has a refractive index smaller than the second refractive index. The first and third regions, 31c and 49, form a cladding region of the optical waveguide, while, the second region 47 forms the core of the waveguide. According to the method described herein, the optical waveguide maybe formed whose patterns exactly reflect those of the mold 33. The third film 49 may be a silicon oxide with the third refractive index. The silicon oxide may increase the refractive index thereof by doping the germanium (Ge), while, may decrease the refractive index by doping the boron (B) or fluoride (F).

(Third Embodiment)

Figure 6A:
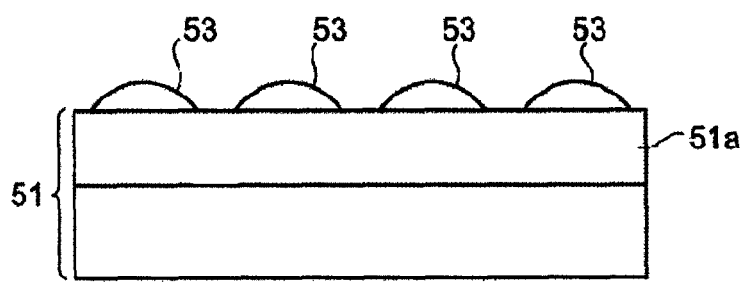

Next, a method for forming a micro-lens according to the third embodiment of the present invention will be described as referring to FIG. 6. Similar to the first embodiment, the resin body 53 with transcribed patterns from the pattern of the mold is formed on the substrate 51. At least surface portion 51a of the substrate 51 includes a material to be formed in the lens. As shown in FIG. 6A, the mask 53 is prepared by detaching the mold from the resin body after the temperature thereof is cooled down. The mold served in the present embodiment, similar to the mold of the first embodiment, has a thermal expansion coefficient smaller than that of the resin body and provides a pattern to be formed in the micro-lens. Prior to form the lens on the surface portion 51a of the substrate 51, a mask for the ion milling used in the next step is prepared by etching the resin body. In this process, an isotropic etching is preferably used to round the pattern transcribed on the resin body.

Figure 6B:
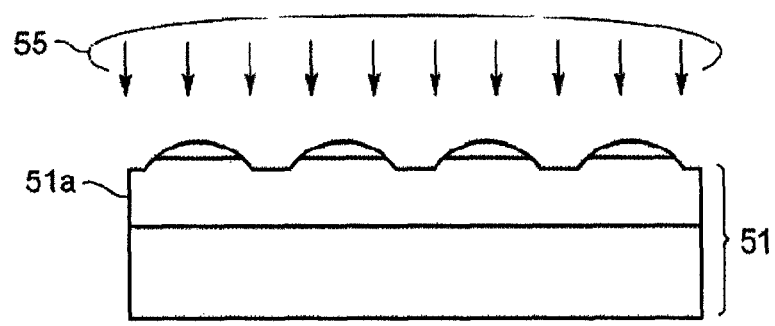
Figure 6C:

Next, the surface portion 51a is milled with thus formed mask 53. The condition for the ion milling is, for example, argon (Ar) ions accelerated by the electric field of 10 kV. Then, the milling rate for the mask 53 becomes substantially equal to that of the first region 51a (FIG. 6B). That is, as shown in FIG. 6B, both the mask 53 and the first region 51a are gradually removed by the ion milling. The ion milling is carried out until the mask 53 is fully removed. Finally, as shown in FIG. 6C, the first region 51b with the micro-lens structure is formed. According to the process thus explained, the micro-lens with a diameter from 0.1 μm to 500 μm can be easily processed.

Thus, the present invention is described as referring to embodiments. In the present invention, the first and third temperatures may be substantially equal to each other. That is, the resin body is hardened by the irradiation of the ultraviolet rays after pressing the mold against the resin body at the room temperature. The mold is detached from the resin body by cooling down the mold and the resin body after the irradiation. Subsequently, the temperature of the resin body recovers the room temperature. Thus, according to the method herein, the difference in the dimension of the pattern may be decreased between the pattern of the mold at the room temperature and that transcribed in the resin body.

The present invention in the principle thereof is thus described in preferred embodiments. However, it may be understood by the person having an ordinal skill in the filed that the present invention may be modified in the arrangement and the details without departure from such principles. For example, although the embodiments relates to the optical waveguide and the micro-lens, the present invention is not restricted to the specific structures disclosed in the embodiments. Although the embodiments exemplarily describes the formation of the optical parts such as the optical waveguide and the lens, the present invention may be utilized for a nano-channel used for handling and analyzing the bio material such as DNA and protein, a pattern for the integrated circuit including nano-scale semiconductor devices, a photo-detector with a nano-scale, a silicon quantum dot, a quantum wire, and a ring transistor. Accordingly, it is therefore contemplated that the appended claims will include any such alternatives, modifications and variations as falling within the true scope and spirit of the present invention.

What is claimed is:

1. A method for forming a predetermined pattern on a resin body by the nano-imprint technique, the method comprising the following sequential steps of:
    (a) forming the resin body that contains ultraviolet curable agents on a substrate;
    (b) pressing a mold that provides the predetermined pattern against the resin body at a first temperature;
    (c) hardening the resin body by irradiation irradiating ultraviolet rays on the resin body as the mold presses against the resin body;
    (d) dropping a temperature of the mold and resin body to a second temperature lower than the first temperature to form a gap between the resin body and the mold as the mold is pressed against the resin body; and (e) detaching the mold from the resin body to form the predetermined pattern on the resin body, wherein the second temperature is lower than the first temperature by 50 to 200° C., and wherein the mold is made of silica and has a thermal expansion coefficient smaller than a thermal expansion coefficient of the resin body so as to enhance the detachment of the mold from the resin body at the second temperature.

2. The method according to claim 1, wherein the ultraviolet rays are irradiated through the mold.

3. The method according to claim 1, wherein the ultraviolet rays are irradiated through the substrate.

4. The method according to claim 1, further including, after the step (e), a step of changing the temperature of the resin body with the pattern transcribed from the predetermined pattern to a third temperature higher than the second temperature, wherein the third temperature is substantially equal to a room temperature.

5. The method according to claim 4, wherein the first temperature is substantially equal to the room temperature.

6. A process for forming an optical waveguide with a predetermined pattern, comprising the following sequential steps of:

(a) forming a resin body that contains ultraviolet curable agents on a first region with a first refractive index on a substrate;

(b) pressing a mold against the resin body at a first temperature, the mold having a transcribed pattern corresponding to the predetermined pattern of the optical waveguide;

(c) hardening the resin body by irradiating ultraviolet rays as the mold is pressed against the resin body;

(d) dropping a temperature of the mold and the resin body to a second temperature lower than the first temperature to form a gap between the resin body and the mold as the mold is pressed against the resin body;

(e) detaching the mold from the resin body to leave the predetermined pattern on the resin body;

(f) etching the first region by the resin body formed with the predetermined pattern as a mask to form the predetermined pattern in the first region, wherein the predetermined pattern formed in the first region has a plurality of grooves; and (g) forming a second region with a pattern corresponding to the predetermined pattern by steps including, (g1) preparing a second film so as to bury the plurality of grooves formed in the first region, and (g2) etching back the second film so as to form a plurality of second regions each burying respective grooves and being isolated to others, the second region having a second refractive index different from the first refractive index; and (h) forming a third region on the first and second regions, the third region having a third refractive index smaller than the second refractive index, wherein the second refractive index is greater than the first refractive index and the third refractive index, wherein the second temperature is lower than the first temperature by 50 to 200° C., and wherein the mold is made of silica and has a thermal expansion coefficient smaller than a thermal expansion coefficient of the resin body so as to enhance the detachment of the mold from the resin body at the second temperature.

7. The process according to claim 6, wherein the first, second and third regions are made of silicon oxide with first, second, and third refractive indices, respectively.

8. A method for forming a micro-lens by a nano-imprinting technique, the method comprising the following sequential steps of:

(a) forming a resin body containing with ultraviolet curable agents on a substrate;

(b) pressing a mold against the resin body at a first temperature, the mold having a transcribed pattern corresponding to the micro-lens;

(c) hardening the resin body by irradiation ultraviolet rays on the resin body as the mold is pressed against the resin body;

(d) changing a temperature of the mold and the resin body to a second temperature lower than the first temperature to form a gap between the resin body and the mold as the mold is pressed against the resin body;

(e) detaching the mold from the resin body to transcribe the pattern for the micro-lens on the resin body;

(f) each the pattern of the micro-lens transcribed on the resin body to expose a portion of the substrate; and (g) milling the substrate with ions by the pattern of the micro-lens transcribed on the resin body as a mask until the mask is fully removed, wherein the milling for the resin body has a rate nearly equal to a rate of the milling for the substrate, wherein the second temperature is lower than the first temperature by 50 to 200° C., and wherein the mold is made of silica and has a thermal expansion coefficient smaller than a thermal expansion coefficient of the resin body so as to enhance the detachment of the mold from the resin body at the second temperature.

9. The method according to claim 1 wherein the first temperature is 25 to 120° C.

10. The method according to claim 1 wherein the second temperature is −100 to 25° C.

11. The process according to claim 6 wherein the first temperature is 25 to 120° C.

12. The process according to claim 6 wherein the second temperature is −100 to 25° C.

13. The method according to claim 8 wherein the first temperature is 25 to 120° C.

14. The method according to claim 8 wherein the second temperature is −100 to 25° C.

* * * * *